(12) United States Patent
Kim

(10) Patent No.: US 9,257,202 B2
(45) Date of Patent: Feb. 9, 2016

(54) SEMICONDUCTOR DEVICES

(71) Applicant: SK hynix Inc., Icheon-si Gyeonggi-do (KR)

(72) Inventor: Kwan Weon Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 169 days.

(21) Appl. No.: 14/174,572

(22) Filed: Feb. 6, 2014

(65) Prior Publication Data

US 2015/0221397 A1  Aug. 6, 2015

(51) Int. Cl.
*G01R 31/28* (2006.01)
*G06F 11/00* (2006.01)
*G11C 29/36* (2006.01)

(52) U.S. Cl.
CPC ........ G11C 29/36 (2013.01); *G11C 2029/3602* (2013.01)

(58) Field of Classification Search
CPC ........ G06F 11/10; G11C 29/36; G11C 29/48; G11C 29/16; G11C 16/10; G11C 29/12015; G11C 29/14; G11C 29/56012; G11C 2029/3602; G11C 2029/5602; G11C 29/50; G11C 29/50012; G11C 11/401; G11C 11/406; G11C 29/50016; G11C 1/40611; G11C 8/18

See application file for complete search history.

(56) References Cited

U.S. PATENT DOCUMENTS

| | | | |
|---|---|---|---|
| 6,771,554 B1 * | 8/2004 | Lazar | G11C 29/12015 365/194 |
| 8,422,324 B2 | 4/2013 | Varrichione et al. | |
| 2001/0054164 A1 * | 12/2001 | Tanizaki | G11C 29/48 714/718 |
| 2008/0048672 A1 * | 2/2008 | Yamaguchi | G11C 17/143 324/550 |
| 2008/0192562 A1 * | 8/2008 | Choi | G11C 29/34 365/230.06 |
| 2009/0016124 A1 * | 1/2009 | Kim | G11C 7/1078 365/194 |
| 2009/0207673 A1 * | 8/2009 | Chu | G11C 29/18 365/189.08 |
| 2009/0219775 A1 * | 9/2009 | Hur | G11C 29/12 365/201 |
| 2011/0158015 A1 * | 6/2011 | Yun | G11C 29/46 365/201 |
| 2012/0002494 A1 * | 1/2012 | Kim | G11C 29/46 365/201 |

FOREIGN PATENT DOCUMENTS

KR  1020070079110 A  8/2007

* cited by examiner

*Primary Examiner* — Guerrier Merant
(74) *Attorney, Agent, or Firm* — William Park & Associates Ltd.

(57) ABSTRACT

A semiconductor device includes a normal test signal generator and a termination signal generator. The normal test signal generator is suitable for generating a first enablement signal and a first pulse signal in response to an external command signal when a first code signal and a second code signal have a predetermined logic combination. Further, the normal test signal generator is suitable for decoding a first test address signal and a second test address signal to generate first to fourth normal test signals. The termination signal generator is suitable for receiving the first pulse signal during an enablement period of the first enablement signal to generate a first termination signal which is enabled when a predetermined signal among the first to fourth normal test signals is generated.

21 Claims, 7 Drawing Sheets

FIG. 6

| COMBINATIONS OF CODE SIGNALS | OPW<1> | OPW<2> | OPW<3> | OPW<4> | OPW<5> | OPW<6> | OPW<7> | OPW<8> | OPW<9> |
|---|---|---|---|---|---|---|---|---|---|
| FIRST COMBINATION | H | L | H | L | H | H | L | H | L |
| SECOND COMBINATION | H | L | H | L | H | H | H | H | L |

SEMICONDUCTOR DEVICES

BACKGROUND

1. Technical Field

Embodiments of the present disclosure generally relate to semiconductor devices and more particularly to semiconductor devices including a normal test signal generator and termination signal generator.

2. Related Art

Semiconductor devices may be designed and fabricated to include a test mode function for evaluating the operation thereof. That is, various parameters of the semiconductor devices may be measured in a test mode at a wafer level or at a package level and the tested semiconductor devices may be sorted into good chips or failed chips according to the test results. Further, each of the semiconductor devices may include various test modes. For example, each of the semiconductor devices may include a normal test mode for evaluating a normal circuit used in input/output (I/O) of data and an extra test mode for evaluating circuits other than the normal circuit.

The semiconductor device may receive a plurality of address signals supplied from an external device to activate a test mode relating to a combination of the address signals and may be tested if the test mode is activated. A test operation in the test mode may be executed by information stored in a mode register set (MRS) and by decoding the plurality of address signals supplied from the external device. Thus, the semiconductor device may be designed to include a decoder that decodes the plurality of address signals.

SUMMARY

Various embodiments are directed to semiconductor devices.

According to some embodiments, a semiconductor device includes a normal test signal generator and a termination signal generator. The normal test signal generator is suitable for generating a first enablement signal and a first pulse signal in response to an external command signal when a first code signal and a second code signal have a predetermined logic combination. In addition, the normal test signal generator is suitable for decoding a first test address signal and a second test address signal to generate first to fourth normal test signals. The termination signal generator is suitable for receiving the first pulse signal during an enablement period of the first enablement signal to generate a first termination signal which is enabled when a predetermined signal among the first to fourth normal test signals is generated.

According to an embodiment, a semiconductor device includes a normal test signal generator, a fuse test signal generator and a termination signal generator. The normal test signal generator is suitable for receiving an external command signal to generate a first enablement signal and a first pulse signal which are enabled when first and second code signals have a first logic combination. Further, the normal test signal generator is suitable for decoding first and second test address signals to generate first to fourth normal test signals. The fuse test signal generator is suitable for receiving the external command signal to generate a second enablement signal and a second pulse signal which are enabled when the first and second code signals have a second logic combination. In addition, the fuse test signal generator is suitable for decoding the first and second test address signals to generate first to fourth fuse test signals. The termination signal generator is suitable for receiving the first and second pulse signals during an enablement period of the first and second enablement signals to generate a first termination signal and a second termination signal which are enabled when a predetermined normal test signal among the first to fourth normal test signals and a predetermined fuse test signal among the first to fourth fuse test signals are generated.

According to further embodiment, a semiconductor device includes a normal test signal generator suitable for generating a first enablement signal and a first pulse signal in response to an external command signal when one or more code signals have a predetermined logic combination and suitable for decoding a first test address signal and a second test address signal to generate one or more normal test signals; and a termination signal generator suitable for receiving the first pulse signal during an enablement period of the first enablement signal to generate a first termination signal which is enabled when a predetermined signal among the one or more normal test signals is generated.

BRIEF DESCRIPTION OF THE DRAWINGS

Embodiments of the present invention will become more apparent in view of the attached drawings and accompanying detailed description, in which:

FIG. 6 is a logic table illustrating combinations of code signals used in a semiconductor device according to some embodiments of the present invention.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
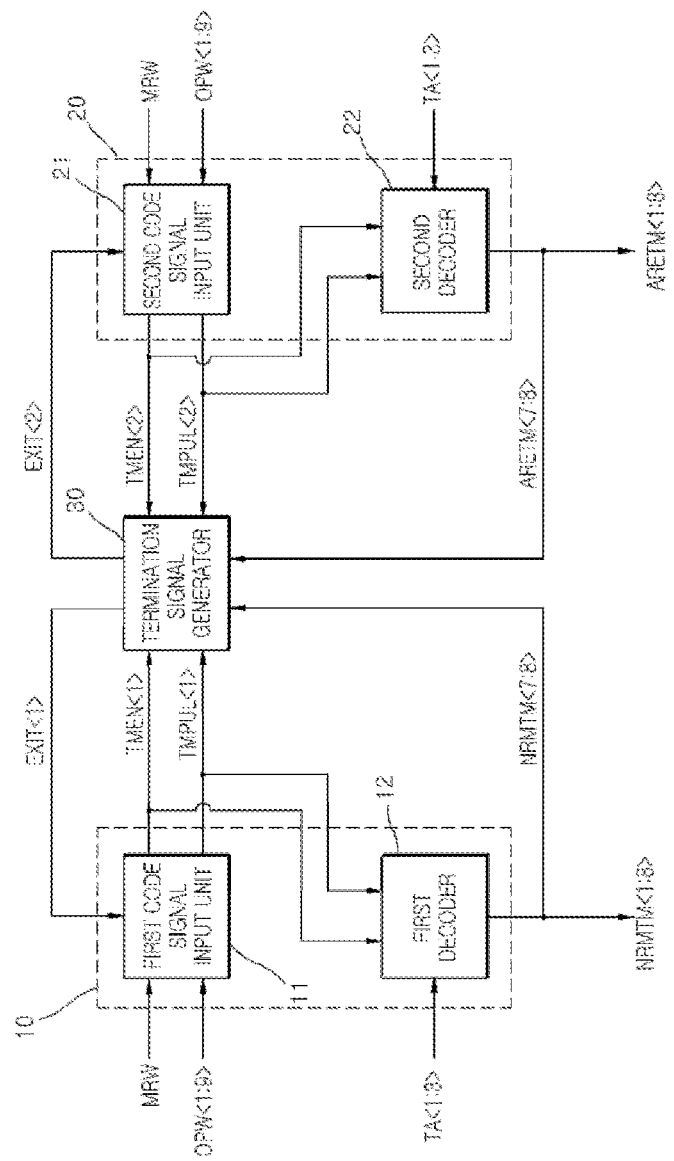
FIG. 1 is a block diagram illustrating a semiconductor device according to some embodiments of the present invention.

Referring to FIG. 1, a semiconductor device according to some embodiments of the present invention may include a normal test signal generator 10, a fuse test signal generator 20 and a termination signal generator 30.

The normal test signal generator 10 may include a first code signal input unit 11 and a first decoder 12. The first code signal input unit 11 may receive an external command signal MRW to generate a first enablement signal TMEN<1> and a first pulse signal TMPUL<1> which are enabled when first to ninth code signals OPW<1:9> having a first logic combination are inputted thereto and which are disabled when a first termination signal EXIT<1> is inputted thereto, and the first decoder 12 may decode first to third test address signals TA<1:3> in response to the first pulse signal TMPUL<1> including pulses, which are periodically created while the first enablement signal TMEN<1> is enabled, to generate first to eighth normal test signals NRMTM<1:8>. In some embodiments, the external command signal MRW and the first to ninth code signals OPW<1:9> may be supplied from a mode register set or an external device to put the semiconductor device in a test mode. In some embodiments, one or more code signals OPW, test address signals TA, and normal test signals NRMTM may be implemented for the embodiments.

The fuse test signal generator 20 may include a second code signal input unit 21 and a second decoder 22. The second code signal input unit 21 may receive the external command signal MRW to generate a second enablement signal TMEN<2> and a second pulse signal TMPUL<2> which are enabled when the first to ninth code signals OPW<1:9> having a second logic combination are inputted thereto and which are disabled when a second termination signal EXIT<2> is inputted thereto, and the second decoder 22 may decode the first to third test address signals TA<1:3> in response to the second pulse signal TMPUL<2> including pulses, which are periodically created while the second enablement signal TMEN<2> is enabled, to generate first to eighth fuse test signals ARETM<1:8>. In some embodiments, one or more code signals OPW, test address signals TA, and fuse test signals ARETM may be implemented for the embodiments.

The first logic combination and the second logic combination of the first to ninth code signals OPW<1:9> will be described in detail later. In some embodiments, the first to eighth normal test signals NRMTM<1:8> may be used as test signals for testing a normal circuit that operates in a read mode or a write mode of the semiconductor device, and the first to eighth fuse test signals ARETM<1:8> may be used as test signals for testing a fuse array that outputs information which is generated according to fuse cut information included in the semiconductor device.

The termination signal generator 30 may receive the first pulse signal TMPUL<1> during an enablement period of the first enablement signal TMEN<1> to generate the first termination signal EXIT<1> which is enabled when the seventh normal test signal NRMTM<7> or the seventh fuse test signal ARETM<7> is generated. Further, the termination signal generator 30 may receive the second pulse signal TMPUL<2> during an enablement period of the second enablement signal TMEN<2> to generate the second termination signal EXIT<2> which is enabled when the eighth normal test signal NRMTM<8> or the eighth fuse test signal ARETM<8> is generated.

Figure 2:
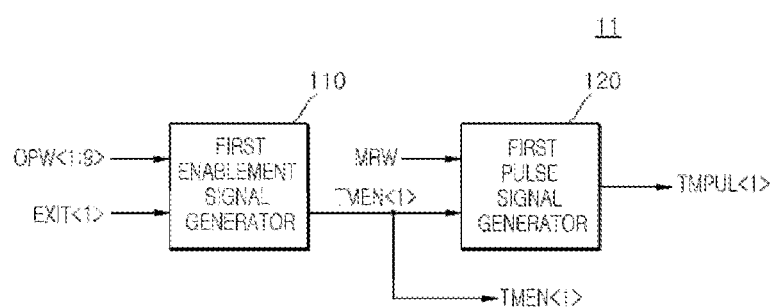
FIG. 2 is a block diagram illustrating a first code signal input unit included in the semiconductor device of FIG. 1.

Referring to FIG. 2, the first code signal input unit 11 may include a first enablement signal generator 110 and a first pulse signal generator 120.

The first enablement signal generator 110 may generate a first enablement signal TMEN<1> which is enabled when the first to ninth code signals OPW<1:9> have the first logic combination and which is disabled when the first termination signal EXIT<1> is enabled.

The first pulse signal generator 120 may generate the first pulse signal TMPUL<1> including pulses which are periodically created in response to the external command signal MRW while the first enablement signal TMEN<1> is enabled.

Figure 3:
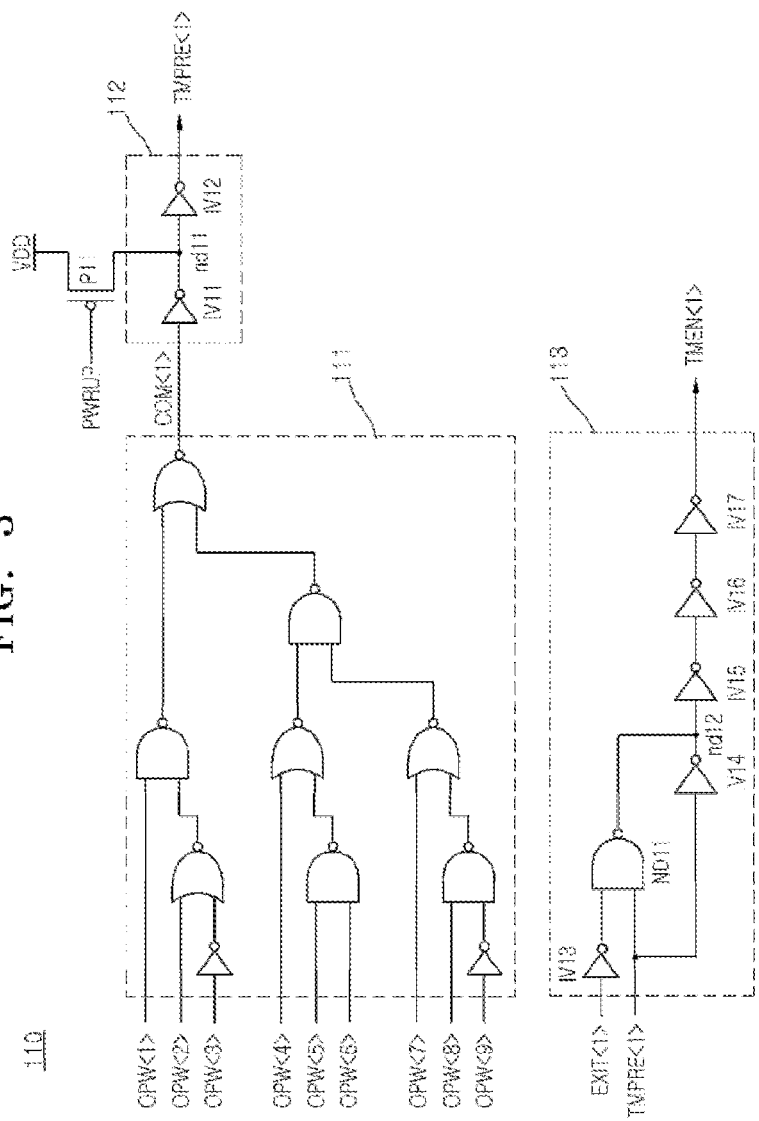
FIG. 3 is a logic circuit diagram illustrating a first enablement signal generator included in the first code signal input unit of FIG. 2.

Referring to FIG. 3, the first enablement signal generator 110 may include a first comparator 111, a first drive element P11, a first buffer 112 and a first logic unit 113.

The first comparator 111 may generate a first comparison signal COM<1> which is enabled to have a logic "high" level when the first to ninth code signals OPW<1:9> have the first logic combination.

The first drive element P11 may be turned on in response to a power-up signal PWRUP, which is enabled to have a logic "low" level during a power-up period, to pull up a node ND11. The power-up period may correspond to a period from a moment that a power supply voltage VDD supplied to the semiconductor device has a ground voltage until a moment that the power supply voltage increases to reaches a predetermined level.

The first buffer 112 may include an inverter IV11 and an inverter IV12 which are cascaded. The inverter IV11 may reverse the first comparison signal COM<1> after the power-up period to output a complementary signal of the first comparison signal COM<1> through the node ND11. The inverter IV12 may reverse a signal of the node ND11 to output a complementary signal of the node ND11 as a first pre-enablement signal TMPRE<1>. That is, the first buffer 112 may buffer the first comparison signal COM<1> after the power-up period to generate the first pre-enablement signal TMPRE<1>.

The first logic unit 113 may buffer the first pre-enablement signal TMPRE<1> through inverters IV14, IV15, IV16 and IV17, which are cascaded, to generate the first enablement signal TMEN<1> when the first termination signal EXIT<1> is disabled to have a logic "low" level. On the other hand, when the first pre-enablement signal TMPRE<1> has a logic "high" level and the first termination signal EXIT<1> has a logic "high" level, the first logic unit 113 may pull up a node ND12 between the inverters IV14 and IV15 through an inverter IV13 and a NAND gate ND11 to generate the first enablement signal TMEN<1> which is disabled. That is, the first logic unit 113 may generate the first enablement signal TMEN<1> having a logic "high" level when the first pre-enablement signal TMPRE<1> has a logic "high" level and may generate the first enablement signal TMEN<1> having a logic "low" level when the first termination signal EXIT<1> has a logic "high" level.

Figure 4:
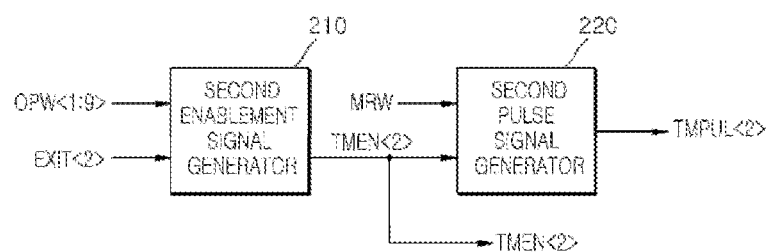
FIG. 4 is a block diagram illustrating a second code signal input unit included in the semiconductor device of FIG. 1.

Referring to FIG. 4, the second code signal input unit 21 may include a second enablement signal generator 210 and a second pulse signal generator 220.

The second enablement signal generator 210 may generate a second enablement signal TMEN<2> which is enabled when the first to ninth code signals OPW<1:9> have the second logic combination and which is disabled when the second termination signal EXIT<2> is enabled.

The second pulse signal generator 220 may generate the second pulse signal TMPUL<2> including pulses which are periodically created in response to the external command signal MRW while the second enablement signal TMEN<2> is enabled.

Figure 5:
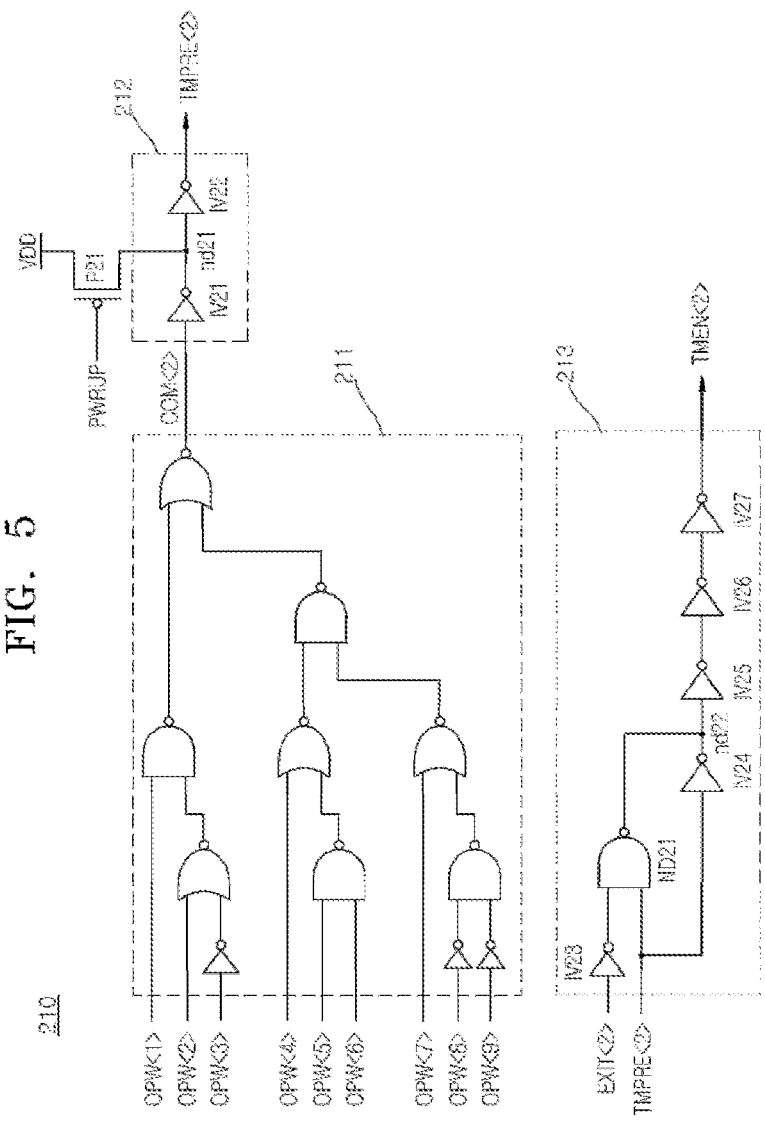
FIG. 5 is a logic circuit diagram illustrating a second enablement signal generator included in the second code signal input unit of FIG. 4.

Referring to FIG. 5, the second enablement signal generator 210 may include a second comparator 211, a second drive element P21, a second buffer 212 and a second logic unit 213.

The second comparator 211 may generate a second comparison signal COM<2> which is enabled to have a logic "high" level when the first to ninth code signals OPW<1:9> have the second logic combination.

The second drive element P21 may be turned on in response to the power-up signal PWRUP, which is enabled to have a logic "low" level during the power-up period, to pull up a node ND21.

The second buffer 212 may include an inverter IV21 and an inverter IV22 which are cascaded. The inverter IV21 may reverse the second comparison signal COM<2> after the power-up period to output a complementary signal of the second comparison signal COM<2> through the node ND21. The inverter IV22 may reverse a signal of the node ND21 to output a complementary signal of the node ND21 as a second pre-enablement signal TMPRE<2>. That is, the second buffer 212 may buffer the second comparison signal COM<2> after the power-up period to generate the second pre-enablement signal TMPRE<2>.

The second logic unit 213 may buffer the second pre-enablement signal TMPRE<2> through inverters IV24, IV25, IV26 and IV27, which are cascaded, to generate the second enablement signal TMEN<2> when the second termination signal EXIT<2> is disabled to have a logic "low" level. On the other hand, when the second pre-enablement signal TMPRE<2> has a logic "high" level and the second termination signal EXIT<2> has a logic "high" level, the second logic unit 213 may pull up a node ND22 between the inverters IV24 and IV25 through an inverter IV23 and a NAND gate ND21 to generate the second enablement signal TMEN<2> which is disabled. That is, the second logic unit 213 may generate the second enablement signal TMEN<2> having a logic "high" level when the second pre-enablement signal TMPRE<2> has a logic "high" level and may generate the second enablement signal TMEN<2> having a logic "low" level when the second termination signal EXIT<2> has a logic "high" level.

The first and second logic combinations of the first to ninth code signals OPW<1:9> will be described hereinafter with reference to a logic table illustrated in FIG. 6.

Referring to FIG. 6, when a logic combination of the first to ninth code signals OPW<1:9> has the first logic combination, the first to ninth code signals OPW<1:9> may have a logic "high(H)" level, a logic "low(L)" level, a logic "high(H)" level, a logic "low(L)" level, a logic "high(H)" level, a logic "high(H)" level, a logic "low(L)" level, a logic "high(H)" level and a logic "low(L)" level, respectively.

When a logic combination of the first to ninth code signals OPW<1:9> has the second logic combination, the first to ninth code signals OPW<1:9> may have a logic "high(H)" level, a logic "low(L)" level, a logic "high(H)" level, a logic "low(L)" level, a logic "high(H)" level, a logic "high(H)" level, a logic "high(H)" level, a logic "high(H)" level and a logic "low(L)" level, respectively. The logic combination of the first to ninth code signals OPW<1:9> may be set to be different according to the embodiments, and the number of bits of the first to ninth code signals OPW<1:9> may also be set to be different according to the embodiments.

Figure 7:
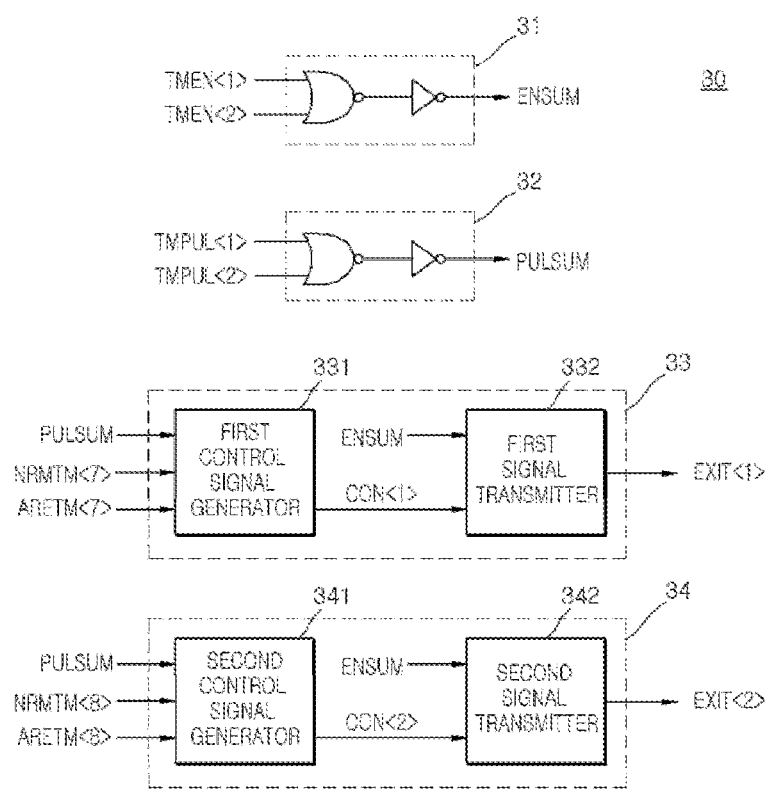
FIG. 7 is a block diagram illustrating a termination signal generator included in the semiconductor device of FIG. 1.

Referring to FIG. 7, the termination signal generator 30 may include a third logic unit 31, a fourth logic unit 32, a first termination signal output unit 33 and a second termination signal output unit 34.

The third logic unit 31 may generate a synthesis enablement signal ENSUM having a logic "high" level when at least one of the first and second enablement signals TMEN<1:2> has a logic "high" level. That is, the third logic unit 31 may generate the synthesis enablement signal ENSUM which is enabled when at least one of the first and second enablement signals TMEN<1:2> is enabled.

The fourth logic unit 32 may generate a synthesis pulse signal PULSUM including a pulse which is created when a pulse of at least one of the first and second pulse signals TMPUL<1:2> is inputted thereto. That is, the fourth logic unit 32 may generate the synthesis pulse signal PULSUM including a pulse which is created when at least one of pulses of the first and second enablement signals TMEN<1:2> is inputted thereto.

The first termination signal output unit 33 may include a first control signal generator 331 and a first signal transmitter 332. The first control signal generator 331 may generate a first control signal CON<1> which is enabled to have a logic "high" level when a pulse of the synthesis pulse signal PUL-SUM is inputted thereto and the seventh normal test signal NRMTM<7> or the seventh fuse test signal ARETM<7> having a logic "high" level is inputted thereto. In an embodiment a third or fourth normal test signal NRMTM<3> or NRMTM<4>, or third or fourth fuse test signal ARETM<3> or ARETM<4> may be inputted into the first control signal generator 331. Additionally, any one of the one or more normal test signals NRMTM or fuse test signals ARETM may be chosen to be inputted into the first control signal generator 331 or generated by the first termination signal output unit 33. The embodiments are not limited to the examples discussed herein regarding which normal test signal is inputted into the first control signal generator 331 or generated by the first termination signal output unit 33. The first signal transmitter 332 may output the synthesis enablement signal ENSUM as the first termination signal EXIT<1> when the first control signal CON<1> is enabled to have a logic "high" level. That is, the first termination signal output unit 33 may generate the first termination signal EXIT<1> which is enabled when a pulse of the synthesis pulse signal PULSUM is inputted thereto and the seventh normal test signal NRMTM<7> or the seventh fuse test signal ARETM<7> is generated.

The second termination signal output unit 34 may include a second control signal generator 341 and a second signal transmitter 342. The second control signal generator 341 may generate a second control signal CON<2> which is enabled to have a logic "high" level when a pulse of the synthesis pulse signal PULSUM is inputted thereto and the eighth normal test signal NRMTM<8> or the eighth fuse test signal ARETM<8> having a logic "high" level is inputted thereto. In an embodiment a fourth normal test signal NRMTM<4>, or fourth fuse test signal or ARETM<4> may be inputted into the second control signal generator 341. Additionally, any one of the one or more normal test signals NRMTM or fuse test signals ARETM may be chosen to be inputted into the second control signal generator 341 or generated by the second termination signal output unit 34. The embodiments are not limited to the examples discussed herein regarding which normal test signal is inputted into the second control signal generator 341 or generated by the second termination signal output unit 34. The second signal transmitter 342 may output the synthesis enablement signal ENSUM as the second termination signal EXIT<2> when the second control signal CON<2> is enabled to have a logic "high" level. That is, the second termination signal output unit 34 may generate the second termination signal EXIT<2> which is enabled when a pulse of the synthesis pulse signal PULSUM is inputted thereto and the eighth normal test signal NRMTM<8> or the eighth fuse test signal ARETM<8> is generated.

An operation of the semiconductor device having the aforementioned configuration will be described hereinafter in conjunction with an example in which the first to ninth code signals OPW<1:9> having the first logic combination are inputted to generate the first to eighth normal test signals NRMTM<1:8> and the first to ninth code signals OPW<1:9> having the second logic combination are then inputted to generate the seventh fuse test signal ARETM<7>.

First, when the first to ninth code signals OPW<1:9> having the first logic combination are inputted to the semiconductor device, the operation of the semiconductor device will be described hereinafter.

The first enablement signal generator 110 of the first code signal input unit 11 may receive the first to ninth code signals OPW<1:9> having the first logic combination to generate the first enablement signal TMEN<1> having a logic "high" level. The first pulse signal generator 120 may receive the first enablement signal TMEN<1> having a logic "high" level and the external command signal MRW to generate the first pulse signal TMPUL<1> including pulses which are periodically created.

The first decoder 12 may decode the first to third test address signals TA<1:3> in response to the first enablement signal TMEN<1> having a logic "high" level at a moment that a pulse of the first pulse signal TMPUL<1> is inputted thereto, thereby generating the first to eighth normal test signals NRMTM<1:8>.

The second enablement signal generator 210 of the second code signal input unit 21 may receive the first to ninth code signals OPW<1:9> having the first logic combination to generate the second enablement signal TMEN<2> having a logic "low" level. The second pulse signal generator 220 may receive the second enablement signal TMEN<2> having a logic "low" level to generate the second pulse signal TMPUL<2> having a logic "low" level.

The second decoder 22 may receive the second enablement signal TMEN<2> having a logic "low" level to terminate generation of the first to eighth fuse test signals ARETM<1:8>.

The third logic unit 31 of the termination signal generator 30 may receive the first enablement signal TMEN<1> having a logic "high" level and the second enablement signal TMEN<2> having a logic "low" level to generate the synthesis enablement signal ENSUM having a logic "high" level. The fourth logic unit 32 may receive the first pulse signal TMPUL<1> including periodic pulses and the second pulse signal TMPUL<2> having a logic "low" level to generate the synthesis pulse signal PULSUM including periodic pulses. The first termination signal output unit 33 may generate the first termination signal EXIT<1> having a logic "low" level in response to the synthesis enablement signal ENSUM having a logic "high" level, the synthesis pulse signal PULSUM including periodic pulses, the seventh normal test signal NRMTM<7> and the seventh fuse test signal ARETM<7>. The second termination signal output unit 34 may generate the second termination signal EXIT<2> having a logic "low" level in response to the synthesis enablement signal ENSUM having a logic "high" level, the synthesis pulse signal PULSUM including periodic pulses, the eighth normal test signal NRMTM<8> and the eighth fuse test signal ARETM<8>.

Next, when the first to ninth code signals OPW<1:9> having the second logic combination are inputted to the semiconductor device, the operation of the semiconductor device will be described hereinafter.

The first enablement signal generator 110 of the first code signal input unit 11 may receive the first termination signal EXIT<1> having a logic "low" level to generate the first enablement signal TMEN<1> having a logic "high" level. The first pulse signal generator 120 may receive the first enablement signal TMEN<1> having a logic "high" level and the external command signal MRW to generate the first pulse signal TMPUL<1> including pulses which are periodically created.

The first decoder 12 may decode the first to third test address signals TA<1:3> in response to the first enablement signal TMEN<1> having a logic "high" level at a moment that a pulse of the first pulse signal TMPUL<1> is inputted thereto, thereby generating the first to eighth normal test signals NRMTM<1:8>.

The second enablement signal generator 210 of the second code signal input unit 21 may receive the first to ninth code signals OPW<1:9> having the second logic combination to generate the second enablement signal TMEN<2> having a logic "high" level. The second pulse signal generator 220 may receive the second enablement signal TMEN<2> having a logic "high" level and the external command signal MRW to generate the second pulse signal TMPUL<2> including pulses which are periodically created.

The second decoder 22 may decode the first to third test address signals TA<1:3> in response to the second enablement signal TMEN<2> having a logic "high" level at a moment that a pulse of the second pulse signal TMPUL<2> is inputted thereto, thereby generating the eighth fuse test signal ARETM<8> of the first to eighth fuse test signals ARETM<1:8>, which is selectively enabled to have a logic "high" level.

The third logic unit 31 of the termination signal generator 30 may receive the first enablement signal TMEN<1> having a logic "high" level and the second enablement signal TMEN<2> having a logic "high" level to generate the synthesis enablement signal ENSUM having a logic "high" level. The fourth logic unit 32 may receive the first pulse signal TMPUL<1> including periodic pulses and the second pulse signal TMPUL<2> including periodic pulses to generate the synthesis pulse signal PULSUM including periodic pulses. The first termination signal output unit 33 may generate the first termination signal EXIT<1> having a logic "high" level in response to the synthesis enablement signal ENSUM having a logic "high" level, the synthesis pulse signal PULSUM including periodic pulses, the seventh normal test signal NRMTM<7> and the seventh fuse test signal ARETM<7>. The second termination signal output unit 34 may generate the second termination signal EXIT<2> having a logic "low" level in response to the synthesis enablement signal ENSUM having a logic "high" level, the synthesis pulse signal PULSUM including periodic pulses, the eighth normal test signal NRMTM<8> and the eighth fuse test signal ARETM<8>.

The first enablement signal generator 110 of the first code signal input unit 11 may receive the first termination signal EXIT<1> having a logic "high" level to generate the first enablement signal TMEN<1> having a logic "low" level. The first pulse signal generator 120 may receive the first enablement signal TMEN<1> having a logic "low" level to generate the first pulse signal TMPUL<1> having a logic "low" level.

The first decoder 12 may receive the first enablement signal TMEN<1> having a logic "low" level to terminate generation of the first to eighth normal test signals NRMTM<1:8>.

The second enablement signal generator 210 of the second code signal input unit 21 may receive the first to ninth code signals OPW<1:9> having the second logic combination to generate the second enablement signal TMEN<2> having a logic "high" level. The second pulse signal generator 220 may receive the second enablement signal TMEN<2> having a logic "high" level and the external command signal MRW to generate the second pulse signal TMPUL<2> including pulses which are periodically created.

The second decoder 22 may decode the first to third test address signals TA<1:3> in response to the second enablement signal TMEN<2> having a logic "low" level at a moment that a pulse of the second pulse signal TMPUL<2> is inputted thereto, thereby generating the first to eighth fuse test signals ARETM<1:8>.

As described above, a semiconductor device having the aforementioned configuration may generate various test signals according to a logic combination of code signals and may control operations for generating the various test signals.

What is claimed is:
1. A semiconductor device comprising:
a normal test signal generator suitable for generating a first enablement signal and a first pulse signal in response to an external command signal when a first code signal and a second code signal have a predetermined logic combination and suitable for decoding a first test address signal and a second test address signal to generate first to fourth normal test signals; and a termination signal generator suitable for receiving the first pulse signal during an enablement period of the first enablement signal to generate a first termination signal which is enabled when a predetermined signal among the first to fourth normal test signals is generated, wherein the first termination signal is a signal, which is enabled to terminate a generation of the first to fourth normal test signals.

2. The semiconductor device of claim 1, wherein the first enablement signal and the first pulse signal are disabled when the first termination signal is enabled.

3. The semiconductor device of claim 1, wherein the normal test signal generator includes:

a first code signal input unit suitable for generating the first enablement signal which is enabled when the first and second code signals have the predetermined logic combination and which is disabled when the first termination signal is inputted thereto and suitable for generating the first pulse signal including pulses which are periodically created during the enablement period of the first enablement signal in response to the external command signal; and a first decoder suitable for decoding the first and second test address signals in response to the pulses of the first pulse signal during the enablement period of the first enablement signal to generate the first to fourth normal test signals.

4. The semiconductor device of claim 3, wherein the first code signal input unit includes:

a first enablement signal generator suitable for generating the first enablement signal which is enabled when the first and second code signals have the predetermined logic combination and which is disabled when the first termination signal is inputted thereto; and a first pulse signal generator suitable for buffering the external command signal during the enablement period of the first enablement signal to generate the first pulse signal.

5. The semiconductor device of claim 4, wherein the first enablement signal generator includes:

a first comparator suitable for generating a first comparison signal which is enabled when the first and second code signals have the predetermined logic combination;

a first drive element suitable for being turned on in response to a power-up signal during a power-up period to pull up a first node;

a first buffer suitable for buffering the first comparison signal after the power-up period to generate a first pre-enablement signal; and a first logic unit suitable for buffering the first pre-enablement signal to generate the first enablement signal, wherein the first logic unit drives a second node to disable the first enablement signal when the first termination signal is inputted thereto.

6. The semiconductor device of claim 1, wherein the termination signal generator includes:

a second logic unit suitable for generating a synthesis enablement signal which is enabled when the first enablement signal is enabled;

a third logic unit suitable for generating a synthesis pulse signal including a pulse which is created when a pulse of the first pulse signal is inputted thereto; and a first termination signal output unit suitable for receiving the synthesis enablement signal and the synthesis pulse signal to generate the first termination signal which is enabled when the third normal test signal is inputted thereto.

7. The semiconductor device of claim 6, wherein the first termination signal is enabled when any one of a plurality of fuse test signals is inputted thereto.

8. The semiconductor device of claim 6, wherein the first termination signal output unit includes:

a first control signal generator suitable for receiving the synthesis pulse signal to generate a first control signal which is enabled when the third normal test signal is inputted thereto; and a first signal transmitter suitable for outputting the synthesis enablement signal as the first termination signal when the first control signal is enabled.

9. A semiconductor device comprising:

a normal test signal generator suitable for receiving an external command signal to generate a first enablement signal and a first pulse signal which are enabled when first and second code signals have a first logic combination and suitable for decoding first and second test address signals to generate first to fourth normal test signals;

a fuse test signal generator suitable for receiving the external command signal to generate a second enablement signal and a second pulse signal which are enabled when the first and second code signals have a second logic combination and suitable for decoding the first and second test address signals to generate first to fourth fuse test signals; and a termination signal generator suitable for receiving the first and second pulse signals during an enablement period of the first and second enablement signals to generate a first termination signal and a second termination signal which are enabled when a predetermined normal test signal among the first to fourth normal test signals and a predetermined fuse test signal among the first to fourth fuse test signals are generated.

10. The semiconductor device of claim 9, wherein the first enablement signal and the first pulse signal are disabled when the first termination signal is enabled.

11. The semiconductor device of claim 9, wherein the second enablement signal and the second pulse signal are disabled when the second termination signal is enabled.

12. The semiconductor device of claim 9, wherein the normal test signal generator includes:

a first code signal input unit suitable for generating the first enablement signal which is enabled when the first and second code signals have the first logic combination and which is disabled when the first termination signal is inputted thereto and suitable for generating the first pulse signal including pulses which are periodically created during an enablement period of the first enablement signal in response to the external command signal; and a first decoder suitable for decoding the first and second test address signals in response to the pulses of the first pulse signal during the enablement period of the first enablement signal to generate the first to fourth normal test signals.

13. The semiconductor device of claim 12, wherein the first code signal input unit includes:

a first enablement signal generator suitable for generating the first enablement signal which is enabled when the first and second code signals have the first logic combination and which is disabled when the first termination signal is inputted thereto; and a first pulse signal generator suitable for buffering the external command signal during the enablement period of the first enablement signal to generate the first pulse signal.

14. The semiconductor device of claim 13, wherein the first enablement signal generator includes:
a first comparator suitable for generating a first comparison signal which is enabled when the first and second code signals have the first logic combination;
a first drive element suitable for being turned on in response to a power-up signal during a power-up period to pull up a first node;
a first buffer suitable for buffering the first comparison signal after the power-up period to generate a first pre-enablement signal; and
a first logic unit suitable for buffering the first pre-enablement signal to generate the first enablement signal,
wherein the first logic unit drives a second node to disable the first enablement signal when the first termination signal is inputted thereto.

15. The semiconductor device of claim 9, wherein the fuse test signal generator includes:
a second code signal input unit suitable for generating the second enablement signal which is enabled when the first and second code signals have the second logic combination and which is disabled when the second termination signal is inputted thereto and suitable for generating the second pulse signal including pulses which are periodically created during an enablement period of the second enablement signal in response to the external command signal; and
a second decoder suitable for decoding the first and second test address signals in response to the pulses of the second pulse signal during the enablement period of the second enablement signal to generate the first to fourth fuse test signals.

16. The semiconductor device of claim 15, wherein the second code signal input unit includes:
a second enablement signal generator suitable for generating the second enablement signal which is enabled when the first and second code signals have the second logic combination and which is disabled when the second termination signal is inputted thereto; and
a second pulse signal generator suitable for buffering the external command signal during the enablement period of the second enablement signal to generate the second pulse signal.

17. The semiconductor device of claim 16, wherein the second enablement signal generator includes:
a second comparator suitable for generating a second comparison signal which is enabled when the first and second code signals have the second logic combination;
a second drive element suitable for being turned on in response to a power-up signal during a power-up period to pull up a third node;
a second buffer suitable for buffering the second comparison signal after the power-up period to generate a second pre-enablement signal; and a second logic unit suitable for buffering the second pre-enablement signal to generate the second enablement signal,
wherein the second logic unit drives a fourth node to disable the second enablement signal when the second termination signal is inputted thereto.

18. The semiconductor device of claim 9, wherein the termination signal generator includes:
a third logic unit suitable for generating a synthesis enablement signal which is enabled when the first enablement signal or the second enablement signal is enabled;
a fourth logic unit suitable for generating a synthesis pulse signal including a pulse which is created when a pulse of the first pulse signal or a pulse of the second pulse signal is inputted thereto;
a first termination signal output unit suitable for receiving the synthesis enablement signal and the synthesis pulse signal to generate the first termination signal which is enabled when the third normal test signal or the third fuse test signal is inputted thereto; and
a second termination signal output unit suitable for receiving the synthesis enablement signal and the synthesis pulse signal to generate the second termination signal which is enabled when the fourth normal test signal or the fourth fuse test signal is inputted thereto.

19. The semiconductor device of claim 18, wherein the first termination signal output unit includes:
a first control signal generator suitable for receiving the synthesis pulse signal to generate a first control signal which is enabled when the third normal test signal or the third fuse test signal is inputted thereto; and
a first signal transmitter suitable for outputting the synthesis enablement signal as the first termination signal when the first control signal is enabled.

20. The semiconductor device of claim 18, wherein the second termination signal output unit includes:
a second control signal generator suitable for receiving the synthesis pulse signal to generate a second control signal which is enabled when the fourth normal test signal or the fourth fuse test signal is inputted thereto; and
a second signal transmitter suitable for outputting the synthesis enablement signal as the second termination signal when the second control signal is enabled.

21. A semiconductor device comprising:
a normal test signal generator suitable for generating a first enablement signal and a first pulse signal in response to an external command signal when one or more code signals have a predetermined logic combination and suitable for decoding a first test address signal and a second test address signal to generate one or more normal test signals; and
a termination signal generator suitable for receiving the first pulse signal during an enablement period of the first enablement signal to generate a first termination signal which is enabled when a predetermined signal among the one or more normal test signals is generated,
wherein the first termination signal is a signal, which is enabled to terminate a generation of the first to fourth normal test signals.

* * * * *